US009054277B2

(12) United States Patent
Lee et al.

(10) Patent No.: US 9,054,277 B2
(45) Date of Patent: Jun. 9, 2015

(54) LIGHT-EMITTING DIODE WITH SIDE-WALL BUMP STRUCTURE AND MOUNTING STRUCTURE HAVING THE SAME

(71) Applicant: Lextar Electronics Corporation, Hsinchu (TW)

(72) Inventors: Chia-En Lee, Chiayi (TW); Cheng-Hung Chen, Hsinchu (TW); Li-Chuan Lin, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/248,461

(22) Filed: Apr. 9, 2014

(65) Prior Publication Data
US 2014/0312379 A1    Oct. 23, 2014

(30) Foreign Application Priority Data
Apr. 22, 2013    (TW) .............................. 102114266 A

(51) Int. Cl.
| | |
|---|---|
| H01L 33/62 | (2010.01) |
| H01L 33/42 | (2010.01) |
| H01L 33/38 | (2010.01) |
| H01L 23/00 | (2006.01) |
| H01L 33/20 | (2010.01) |

(52) U.S. Cl.
CPC .................. H01L 33/42 (2013.01); *H01L 33/62* (2013.01); *H01L 33/20* (2013.01); H01L 33/385 (2013.01); H01L 24/13 (2013.01); *H01L 2224/13027* (2013.01); *H01L 2224/13101* (2013.01); *H01L 2224/13339* (2013.01); *H01L 2924/12041* (2013.01)

(58) Field of Classification Search
USPC .......... 438/25–29, 106; 257/98, 99, 100, 711, 257/731, 733, E33.057, E23.003, E21.499, 257/E21.5, E21.501, E21.502, E21.503, 257/E21.504, E21.505, E21.506, E21.507, 257/E21.508, E21.509, E21.51, E21.511, 257/E21.512, E21.513
See application file for complete search history.

(56) References Cited

U.S. PATENT DOCUMENTS

2009/0134425 A1 *    5/2009    Nagai .............................. 257/99

* cited by examiner

*Primary Examiner* — Julio J Maldonado
*Assistant Examiner* — Robert Bates
(74) *Attorney, Agent, or Firm* — McClure, Qualey & Rodack, LLP

(57) ABSTRACT

A light-emitting diode (LED) with a bump structure on a sidewall is provided. The LED comprises a substrate, an epitaxial structure, a first conductive bump, a second conductive bump, a first extended electrode and a second extended electrode. The substrate has a top surface, a first side surface and an inclined surface between the top surface and the first side surface. The epitaxial structure is disposed on the top surface of the substrate, and comprises a N-type semiconductor layer, a light-emitting layer, a P-type semiconductor layer, a transparent conductive layer, a P-electrode and a N-electrode. The first extended electrode and the second extended electrode connect the P-electrode and the N-electrode, extend through the inclined surface, and are electrically connected to the first and the second conductive bumps, respectively. A mounting structure comprises said LED, a sub-mount and a connector mounting the LED onto the sub-mount.

17 Claims, 4 Drawing Sheets

LIGHT-EMITTING DIODE WITH SIDE-WALL BUMP STRUCTURE AND MOUNTING STRUCTURE HAVING THE SAME

This application claims the benefit of Taiwan application Serial No. 102114266, filed on Apr. 22, 2013, the subject matter of which is incorporated herein by reference.

BACKGROUND

1. Technical Field

The invention relates in general to a light-emitting diode (LED) and a mounting structure having the same. More particularly, the invention relates to a LED with a bump structure on a sidewall, and a mounting structure having the same.

2. Description of the Related Art

In the application of lighting appliances, the light emitted by LED is very concentrated. When applied as a high-angle all-around lighting source, the LED requires disposition of extra components such as second lens and light guide plate, or the LED may need to be disposed on a frame that enables the LED to irradiate towards different directions to achieve high-angle lighting effect can be achieved. However, such extra components always increase manufacturing cost. For instance, the lens is very expensive. In addition, the mechanism design of the frame also increases cost.

Another design to achieving high-angle all-around lighting source is making the LED erected on the sub-mount, such that the light-emitting layer is perpendicular to the sub-mount, hence reducing the light emitting restriction of LED. However, it is very difficult to electrically connect an erected conventional LED grain to the sub-mount because the electrodes thereof are disposed parallel to the light-emitting layer. Therefore, such design is limited from further development.

SUMMARY

The invention is directed to a LED with a bump structure on a sidewall that is suitable for the erect design, and a mounting structure having the same. With a LED according to this invention being erected on the sub-mount, high-angle lighting effect can be easily achieved.

According to one embodiment of the present invention, a LED is provided. The LED comprises a substrate, an epitaxial structure, a first conductive bump, a second conductive bump, a first extended electrode and a second extended electrode. The substrate has a top surface, a first side surface and at least one inclined surface. The top surface and the first side surface are perpendicular to each other, and the inclined surface is disposed between and connects the top surface and the first side surface. The epitaxial structure is disposed on the top surface of the substrate, and comprises a N-type semiconductor layer, a light-emitting layer, a P-type semiconductor layer, a transparent conductive layer, a P-electrode and a N-electrode. The N-type semiconductor layer is disposed on the substrate. The light-emitting layer is disposed on the N-type semiconductor layer. The P-type semiconductor layer is disposed on the light-emitting layer, and has an opening exposing a portion of the N-type semiconductor layer. The transparent conductive layer is disposed on the P-type semiconductor layer. The P-electrode is disposed on the P-type semiconductor layer. The N-electrode is disposed on the exposed portion of the N-type semiconductor layer. The first conductive bump is disposed on the first side surface. The second conductive bump is disposed on the same first side surface as the first conductive bump. The first extended electrode connects the P-electrode, extends through the inclined surface, and is electrically connected to the first conductive bump disposed on the first side surface. The second extended electrode connects the N-electrode, extends through the inclined surface, and is electrically connected to the second conductive bump disposed on the first side surface.

According to another embodiment of the present invention, a LED mounting structure is provided. The LED mounting structure comprises a light-emitting element, a sub-mount and a connector. The light-emitting element is, for example, a LED as described above. The connector connects the first side surface of the LED and the sub-mount to mount the LED onto the sub-mount.

Figure 1:
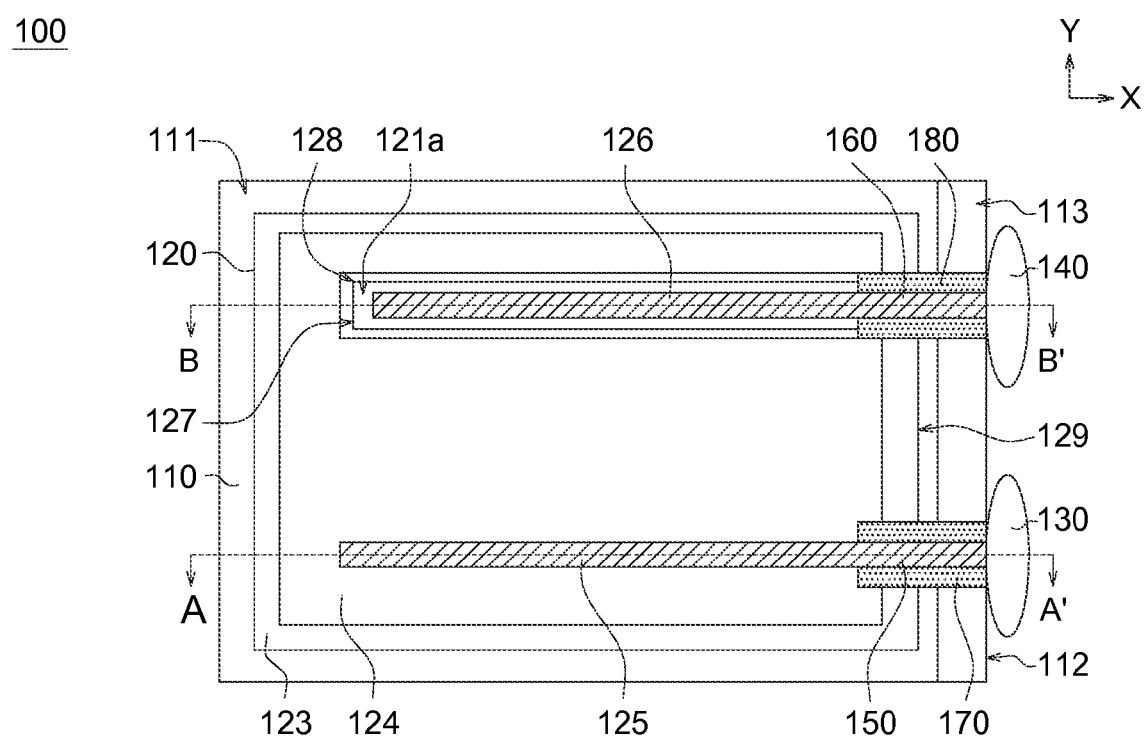
FIG. 1 is a top view of a LED according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
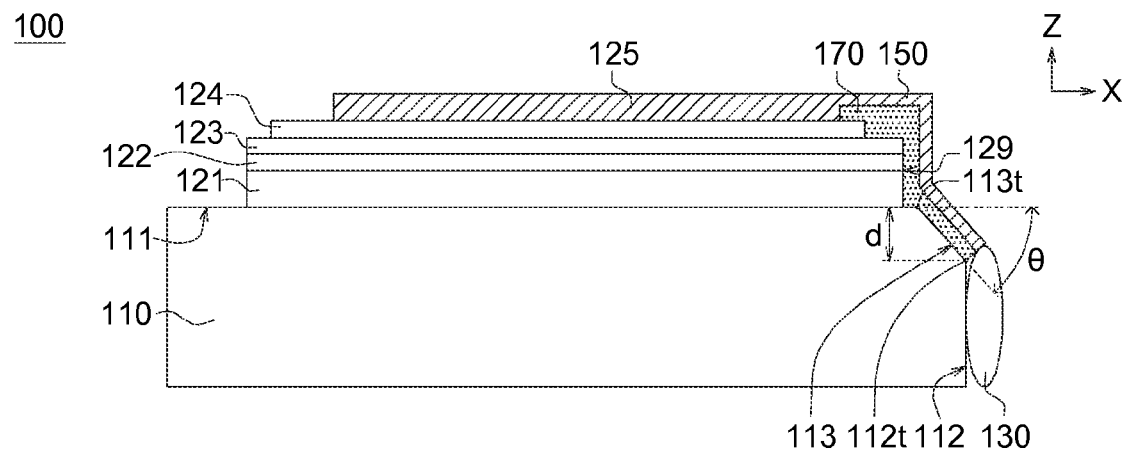
FIG. 2 is a cross-sectional view of the LED of FIG. 1 along cross-sectional line A-A'.
Figure 3:
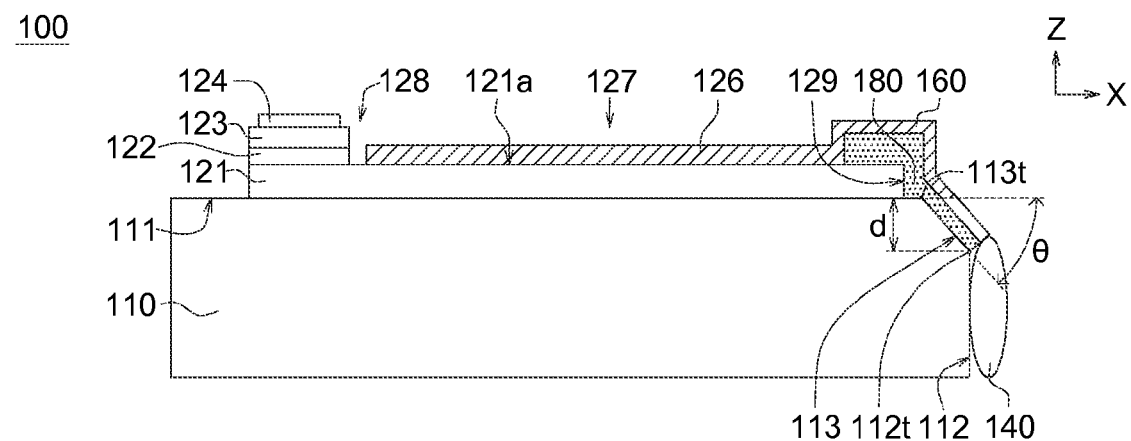
FIG. 3 is a cross-sectional view of the LED of FIG. 1 along cross-sectional line B-B'.

FIGS. 1-3 illustrate a light-emitting diode (LED) 100 according to one embodiment of the invention. FIG. 1 is a top view of the LED 100. FIG. 2 is a cross-sectional view of the LED 100 along cross-sectional line A-A' shown in FIG. 1. FIG. 3 is a cross-sectional view of the LED 100 along cross-sectional line B-B' shown in FIG. 1.

The LED 100 comprises a substrate 110, an epitaxial structure 120, a first conductive bump 130, a second conductive bump 140, a first extended electrode 150 and a second extended electrode 160.

The substrate 110, such as a sapphire substrate, has a top surface 111, a first side surface 112 and at least one inclined surface 113. The top surface 111 and the first side surface 112 are perpendicular to each other, and the inclined surface 113 is disposed between and connects the top surface 111 and the first side surface 112. The inclined surface 113 has an inclined angle with respect to the top surface 111. The inclined angle is in a range between 30° and 75° to facilitate the disposition of the first extended electrode 150 and the second extended electrode 160. The distance d, i.e. the vertical height from the top 113t of the inclined surface 113 to the top 112t of the first side surface 112, is in a range between 10 μm and 60 μm. As such, the length of the inclined surface 113 can be controlled so as to facilitate the disposition of the first extended electrode 150 and the second extended electrode 160 without decrease the area ratio of the light-emitting area.

The epitaxial structure 120 is disposed on the top surface 111 of the substrate 110, and comprises a N-type semiconductor layer 121, a light-emitting layer 122, a P-type semiconductor layer 123, a transparent conductive layer 124, a P-electrode 125 and a N-electrode 126. The N-type semiconductor layer 121 is disposed on the substrate 110. The P-type semiconductor layer 123 is disposed on the light-emitting layer 122, and has an opening 127. The transparent conductive layer 124 is disposed on the P-type semiconductor layer 123, and has an opening 128. The transparent conductive layer 124 may be formed from indium tin oxide (ITO). A sidewall 129 of the epitaxial structure 120 is adjacent to the inclined surface 113 of the substrate 110.

As shown in FIG. 2, the P-electrode 125 is disposed on the P-type semiconductor layer 123, and is electrically connected to the P-type semiconductor layer 123 through the transparent conductive layer 124. As shown in FIG. 3, the light-emitting layer 122 exposes a portion 121a of the N-type semiconductor layer 121. The opening 127 of the P-type semiconductor layer 123 also exposes the portion 121a not covered by the light-emitting layer 122. The N-electrode 126 is disposed on this portion 121a, and the opening 128 of the transparent conductive layer 124 exposes the portion 121a of the N-type semiconductor layer 121 and the N-electrode 126. In the present embodiment, as shown in FIG. 1, the P-electrode 125 and the N-electrode 126 are disposed parallel to each other, but the invention is not limited thereto. Any disposition, of the P-electrode 125 and the N-electrode 126 may have various configuration, arrangement, length and shape as long as the P-electrode 125 and the N-electrode 126 are connected to the P-type semiconductor layer 123 and the N-type semiconductor layer 121, respectively. For instance, the P-electrode 125 and the N-electrode 126 may be disposed in parallel or not. Further, the shapes and lengths of the P-electrode 125 and the N-electrode 126 can be adjusted according to product requirement or the needs in the manufacturing process. The P-electrode 125 and the N-electrode 126 may be formed from a material comprising, for example, chromium, platinum or gold.

The first conductive bump 130 is disposed on the first side surface 112 of the substrate 110. The second conductive bump 140 is disposed on the same first side surface 112 as the first conductive bump 130. The first conductive bump 130 and the second conductive bump 140 are formed from a conductive material with mounting effect, such as silver colloid or solder paste.

Referring to FIG. 2, the first extended electrode 150 connects the P-electrode 125, extends through the inclined surface 113, and is electrically connected to the first conductive bump 130 disposed on the first side surface 112. Referring to FIG. 3, the second extended electrode 160 connects the N-electrode 126, extends through the inclined surface 113, and is electrically connected to the second conductive bump 140 disposed on the first side surface 112. Since the inclined surface 113 inclines at an angle between 30° and 75°, the first and the second extended electrodes 150 and 160 can be easily electroplated in the structure. The first and the second extended electrodes 150 and 160 may be formed from the same material as that of the P-type and the N-electrodes 125 and 126, such as chromium, platinum or gold. The first and the second extended electrodes 150 and 160 as well as the P-type and the N-electrodes 125 and 126 may be formed by the same manufacturing process.

The first extended electrode 150 and the second extended electrode 160 cross over the inclined surface 113, and electrically connect the P-electrode 125 and the N-electrode 126 respectively to the first conductive bump 130 and the second conductive bump 140 that are disposed on a surface perpendicular to the surface the P-electrode 125 and the N-electrode 126 disposed. Thus, even the LED 100 being erected, it still can be electrically connected to the sub-mount through the first and the second conductive bumps 130 and 140 disposed on the first side surface 112, which is perpendicular to the light-emitting layer 122.

The LED 100 may further comprise a first dielectric layer 170 and a second dielectric layer 180. The first and the second dielectric layers 170 and 180 are respectively disposed between the first and the second extended electrodes 150 and 160 and the epitaxial structure 120, such that the first and the second extended electrodes 150 and 160 are electrically isolated from the epitaxial structure 120. As such, it is able to avoid the N-type and the P-type semiconductor layers 121 and 123 of the epitaxial structure 120 from electrically connecting the first and the second extended electrodes 150 and 160 and thereby making the LED 100 failed. The first dielectric layer 170 is disposed between the first extended electrode 150 and the epitaxial structure 120, and covers at least a portion of a sidewall 129 of the epitaxial structure 120. The second dielectric layer 180 is disposed between the second extended electrode 160 and the epitaxial structure 120, covers at least a portion of the sidewall 129 of the epitaxial structure 120, and optionally further covers the portion of the opening 127 of P-type semiconductor layer 123 that is not covered by the N-electrode 126. The first dielectric layer 170 and the second dielectric layer 180 may be formed from a material comprising silicon oxide or silicon nitride.

Figure 4A:
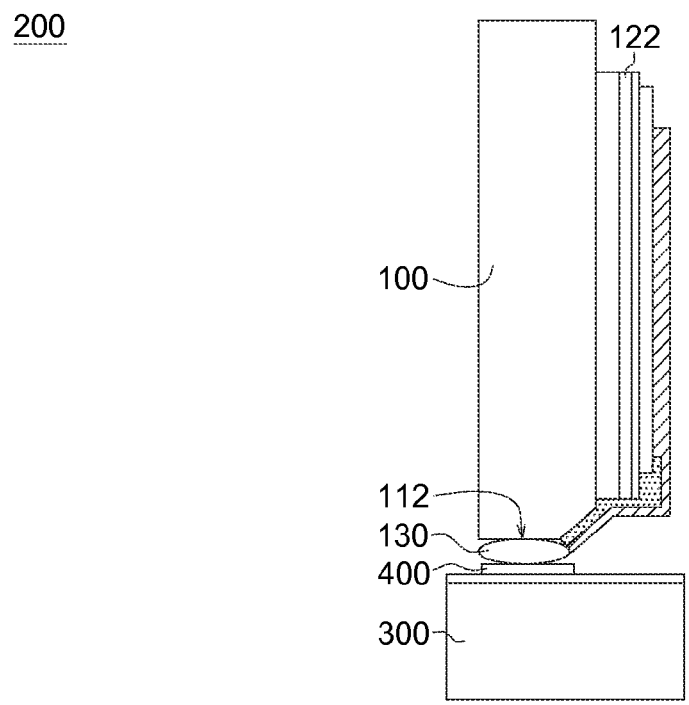
FIGS. 4A-4B schematically show a LED mounting structure according to one embodiment of the invention.
Figure 4B:
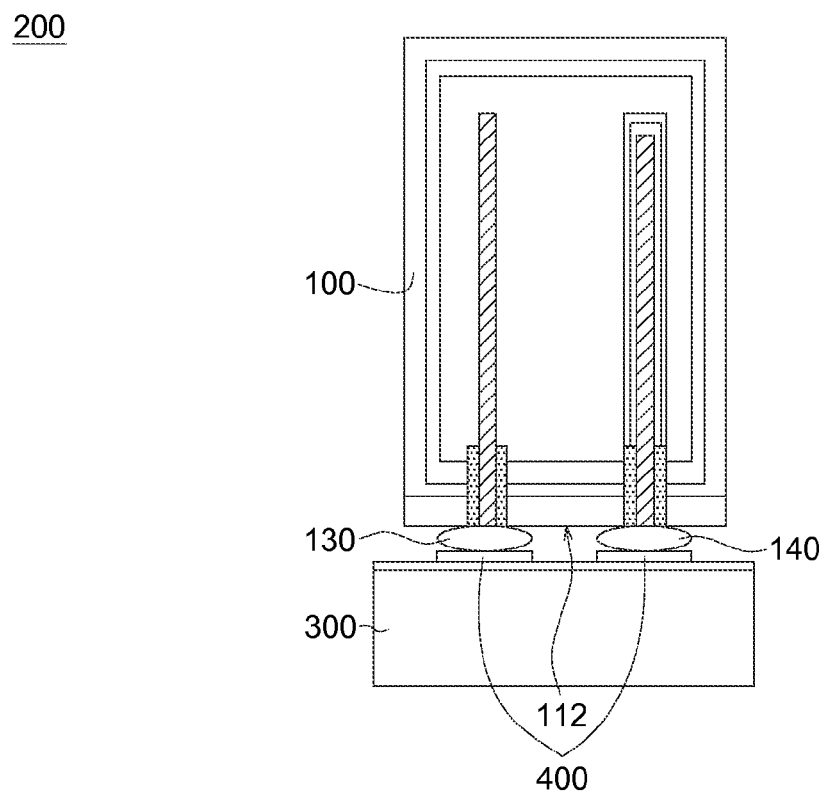

FIGS. 4A-4B illustrate a LED mounting structure 200 according to one embodiment of the invention with the LED 100. FIG. 4A is a side view of the mounting structure 200. FIG. 4B is a front view of the mounting structure 200. For the purpose of simplification, some elements and reference numerals are omitted.

The mounting structure 200 comprises said LED 100, a sub-mount 300 and a connector 400. The connector 400 connects the first side surface 112 of the LED 100 to the sub-mount 300 so as to mount the LED 100 onto the sub-mount 300. The connector 400 is electrically connected to the sub-mount 300 with the first conductive bump 130 and the second conductive bump 140 disposed on the first side surface 112.

The LED 100 comprises the first and the second extended electrodes 150 and 160 through which the P-type and the N-electrodes 125 and 126 are electrically connected to the first and the second conductive bumps 130 and 140, respectively. As such, even when the LED 100 is erected such that the light-emitting layer 122 of the LED 100 is perpendicular to the sub-mount 300, the LED 100 still can be electrically connected to the sub-mount 300 through the first and the second conductive bumps 130 and 140 disposed on the first side surface 112. Thus, a high-angle lighting effect can be achieved.

Now the LED 100 according to one embodiment of the invention and the mounting structure 200 having the same have been fully described. However, the invention is not limited to the above implementations, and modifications or adjustments can be made according to product requirement and the needs in the manufacturing process.

Figure 5A:
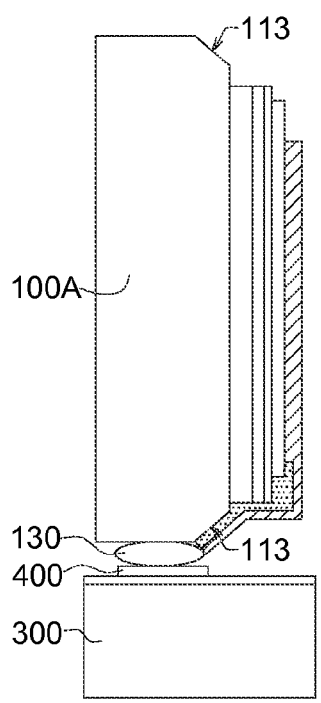
FIGS. 5A-5B schematically show a LED mounting structure according to another embodiment of the invention.
Figure 5B:
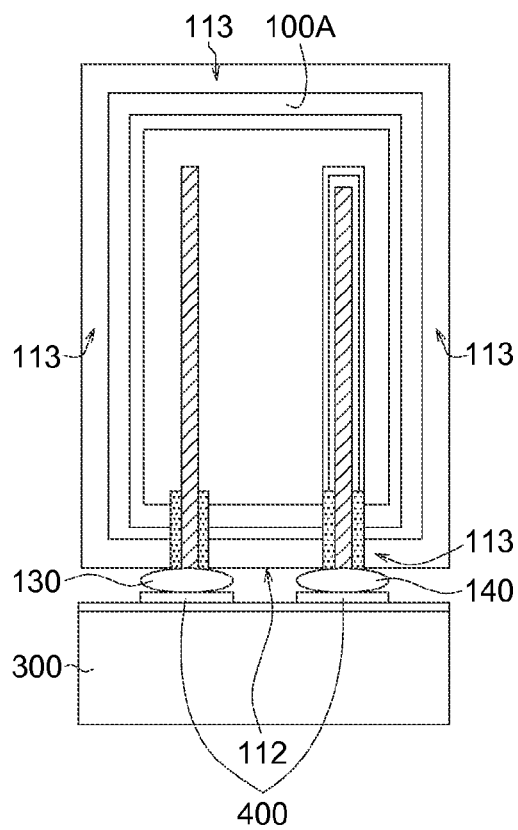

FIGS. 5A-5B illustrate a LED mounting structure 200A according to another embodiment of the invention. For the purpose of simplification, some elements and reference numerals are omitted. The LED mounting structure 200A comprises a LED 100A different from that of the mounting structure 200. The difference between the LED 100A and the LED 100 is that, in the LED 100A, the inclined surface 113 is formed on four sides of the substrate 110 for convenience of manufacturing process. Other features of the LED 100A are the same as that of the LED 100, and are not repeated here.

In a LED of according to this invention, electrodes parallel to the light-emitting layer are electrically connected to conductive bumps perpendicular to the light-emitting layer through extended electrodes, and then are further electrically connected to the sub-mount of the mounting structure through the conductive bumps. With such structure, the LED can be easily erected, such that the light-emitting layer can be disposed perpendicular to the sub-mount, and thereby a high-angle lighting effect can be achieved. Moreover, since the high-angle lighting effect is achieved by changing the design of grains of the LED in this invention, no extra lens, light guide plate or frame is required, thus the high-angle all-around lighting source can be achieved at a low cost.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A light-emitting diode (LED), comprising:
   a substrate having a top surface, a first side surface and at least one inclined surface, wherein the top surface and the first side surface are perpendicular to each other, and the inclined surface is disposed between and connects the top surface and the first side surface;
   an epitaxial structure disposed on the top surface of the substrate, comprising:
      a N-type semiconductor layer disposed on the substrate;
      a light-emitting layer disposed on the N-type semiconductor layer;
      a P-type semiconductor layer disposed on the light-emitting layer and having an opening exposing a portion of the N-type semiconductor layer;
      a transparent conductive layer disposed on the P-type semiconductor layer;
      a P-electrode disposed on the P-type semiconductor layer; and
      a N-electrode disposed on the exposed portion of the N-type semiconductor layer;
   a first conductive bump disposed on the first side surface;
   a second conductive bump disposed on the same first side surface as the first conductive bump;
   a first extended electrode connecting the P-electrode, extending through the inclined surface, and electrically connecting the first conductive bump disposed on the first side surface; and
   a second extended electrode connecting the N-electrode, extending through the inclined surface, and electrically connecting the second conductive bump disposed on the first side surface.

2. The LED according to claim 1, further comprising:
   a first dielectric layer disposed between the first extended electrode and the epitaxial structure, wherein the first dielectric layer covers at least a sidewall of the epitaxial structure adjacent to the inclined surface; and
   a second dielectric layer disposed between the second extended electrode and the epitaxial structure, wherein the second dielectric layer covers at least the sidewall of the epitaxial structure.

3. The LED according to claim 2, wherein the second dielectric layer further covers the portion of the opening of the P-type semiconductor layer not covered by the N-electrode.

4. The LED according to claim 2, wherein the first dielectric layer and the second dielectric layer are formed from a material comprising silicon oxide or silicon nitride.

5. The LED according to claim 1, wherein the inclined surface has an inclined angle with respect to the top surface, and the inclined angle is in a range between 30° and 75°.

6. The LED according to claim 1, wherein the vertical height from the top of the inclined surface to the top of the first side surface is in a range between 10 μm and 60 μm.

7. The LED according to claim 1, wherein the P-electrode is electrically connected to the P-type semiconductor layer through the transparent conductive layer, and the transparent conductive layer has an opening exposing the portion of the N-type semiconductor layer and the N-electrode.

8. The LED according to claim 1, wherein the P-electrode and the N-electrode are disposed parallel to each other.

9. The LED mounting structure according to claim 8, wherein the LED further comprises:
   a first dielectric layer disposed between the first extended electrode and the epitaxial structure, wherein the first dielectric layer covers at least a sidewall of the epitaxial structure adjacent to the inclined surface; and
   a second dielectric layer disposed between the second extended electrode and the epitaxial structure, wherein the second dielectric layer covers at least the sidewall of the epitaxial structure.

10. The LED mounting structure according to claim 9, wherein the second dielectric layer further covers the portion of the opening of the P-type semiconductor layer not covered by the N-electrode.

11. The LED mounting structure according to claim 9, wherein the first dielectric layer and the second dielectric layer are formed from a material comprising silicon oxide or silicon nitride.

12. A LED mounting structure, comprising:
    the LED according to claim 1;
    a sub-mount; and
    a connector connecting the first side surface of the LED to the sub-mount to mount the LED onto the sub-mount.

13. The LED mounting structure according to claim 12, wherein the inclined surface has an inclined angle with respect to the top surface, and the inclined angle is in a range between 30° and 75°.

14. The LED mounting structure according to claim 12, wherein the vertical height from the top of the inclined surface to the top of the first side surface is in a range between 10 μm and 60 μm.

15. The LED mounting structure according to claim 12, wherein the P-electrode is electrically connected to the P-type semiconductor layer through the transparent conductive layer, and the transparent conductive layer has an opening exposing the portion of the N-type semiconductor layer and the N-electrode.

16. The LED mounting structure according to claim 12, wherein the connector is electrically connected to the sub-mount with the first conductive bump and the second conductive bump.

17. The LED mounting structure according to claim 12, wherein the first conductive bump and the second conductive bump are formed from a material comprising silver colloid or solder paste.

* * * * *